(12) United States Patent
Lee

(10) Patent No.: US 8,187,942 B2
(45) Date of Patent: May 29, 2012

(54) METHOD FOR MANUFACTURING SEMICONDUCTOR DEVICE HAVING A DUAL GATE INSULATION LAYER

(75) Inventor: Young Bang Lee, Incheon Metropolitan (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 273 days.

(21) Appl. No.: 12/634,889

(22) Filed: Dec. 10, 2009

(65) Prior Publication Data

US 2010/0261325 A1 Oct. 14, 2010

(30) Foreign Application Priority Data

Apr. 10, 2009 (KR) .......................... 10-2009-0031416

(51) Int. Cl.
*H01L 21/8234* (2006.01)
(52) U.S. Cl. ................. 438/275; 438/981; 257/E21.625
(58) Field of Classification Search .................. 438/751, 438/950, 981; 257/E21.258
See application file for complete search history.

(56) References Cited

U.S. PATENT DOCUMENTS

| 5,970,345 A | * | 10/1999 | Hattangady et al. | .......... 438/279 |
| 6,713,353 B1 | * | 3/2004 | Yoshida et al. | .............. 438/275 |
| 7,179,750 B2 | * | 2/2007 | Kim et al. | ..................... 438/723 |
| 2003/0082912 A1 | | 5/2003 | Kezuka et al. | |
| 2006/0138399 A1 | | 6/2006 | Itano et al. | |

FOREIGN PATENT DOCUMENTS

KR 1020050064311 A 6/2005
KR 1020080084278 A 9/2008

* cited by examiner

*Primary Examiner* — Chandra Chaudhari
(74) *Attorney, Agent, or Firm* — Ladas & Parry LLP

(57) ABSTRACT

A method for manufacturing a semiconductor device having a dual gate insulation layer is presented. The method includes a step of forming a first insulation layer on a semiconductor substrate which has a first region and a second region. The method includes a step of selectively removing a portion of the first insulation layer formed the second region of the semiconductor substrate. The removal of the portion of the first insulation layer is conducted using an etching solution comprising propylene glycol, HF and amine. The method also includes a step of forming a second insulation layer on the first insulation layer in the first region and on the semiconductor substrate in the second region.

12 Claims, 5 Drawing Sheets

METHOD FOR MANUFACTURING SEMICONDUCTOR DEVICE HAVING A DUAL GATE INSULATION LAYER

CROSS-REFERENCE TO RELATED APPLICATIONS

The present application claims priority to Korean patent application number 10-2009-0031416 filed on Apr. 10, 2009, which is incorporated herein by reference in its entirety.

BACKGROUND OF THE INVENTION

The present invention relates to a method for manufacturing a semiconductor device, and more particularly, to a method for manufacturing a semiconductor device which can lessen step formation due to unwanted losses of an isolation layer and thereby stabilize the characteristics of a gate insulation layer.

Generally gate insulation layers in semiconductor devices are grown through annealing or rapid thermal annealing processes that produce a silicon oxide layer (an $SiO_2$ layer). As the design rules demand more diminutive semiconductor devices, the thickness of the gate insulation layer is reduced down to a thickness level that defines a tunneling limit.

Due to the refresh characteristics of transistors in a cell region, the transistors in the cell region require a higher threshold voltage (Vt) than transistors in a peripheral region. Hence, a relatively higher voltage is applied to the transistors in the cell region, as a result of which the electrical performance of the transistors in the cell region are degraded as compared to those transistors in the peripheral region.

Under these circumstances, in order to prevent the electrical performance of the transistors in the cell region from being degraded, a method of forming a dual gate insulation layer has been proposed. This method results in forming a thicker gate insulation layer of transistors in a cell region relatively to that in a peripheral region.

However, in the conventional method for forming a dual gate insulation layer, when conducting a wet etching process for selectively removing the gate insulation layer in the peripheral region, not only the gate insulation layer in the peripheral region is removed, but also unwanted losses to the isolation layer result in a step portion when formed between an active region and the isolation layer.

In order to accommodate the trend toward high integration of a semiconductor device, an SOD (spin-on dielectric) insulation layer is used which provides excellent gapfill characteristics when formed in an isolation trench that has an increased aspect ratio. Unfortunately, the resultant SOD insulation layer exhibits unwanted characteristics in that the SOD insulation layer is prone to being easily etched when conducting wet etching processes. As a result, losses of the isolation layer markedly increase and the thickness of a step portion increases up to 350 Å.

If the step portion is formed between the active region and the isolation layer due to the loss of the isolation layer, then the characteristics of the gate insulation layer become unstable. Furthermore, residues are created on the step portion when subsequently conducting a masking process and an etching process for forming gates. Because of these facts, defects are likely to occur in a semiconductor substrate and the performance characteristics and reliability of a semiconductor device can deteriorate.

BRIEF SUMMARY OF THE INVENTION

Embodiments of the present invention are directed to a method for manufacturing a semiconductor device which can lessen step formation due to minimizing losses of an isolation layer and thereby result in stabilizing the characteristics of a gate insulation layer.

Also, embodiments of the present invention are directed to a method for manufacturing a semiconductor device that can substantially prevent defects from occurring in a semiconductor substrate and improve the characteristics and reliability of the resultant a semiconductor device.

In one embodiment of the present invention, a method for manufacturing a semiconductor device comprises the steps of forming a first insulation layer on a semiconductor substrate which has a first region and a second region; selectively removing a portion of the first insulation layer formed the second region of the semiconductor substrate; and forming a second insulation layer on the first insulation layer in the first region and on the semiconductor substrate in the second region, wherein removal of the portion of the first insulation layer is conducted using an etching solution comprising propylene glycol, HF and amine.

The first region may be a cell region and the second region may be a peripheral region.

The step of selectively removing the portion of the first insulation layer may be implemented using a mask pattern that to exposes the second region.

The removal of the portion of the first insulation layer may be conducted for about 80~120 seconds.

The method may further comprise the steps of sequentially forming, after forming the second insulation layer, a conductive layer and a hard mask layer on the second insulation layer; and forming gates, after forming the second insulation layer, in the first region and the second region of the semiconductor substrate by etching the hard mask layer, the conductive layer, and the second and first insulation layers.

In another embodiment of the present invention, a method for manufacturing a semiconductor device comprises the steps of forming a first insulation layer on a semiconductor substrate which has a first region and a second region; forming a barrier layer on the first insulation layer; forming a mask pattern on the barrier layer to expose the second region; removing a portion of the barrier layer which is exposed in the second region to expose a portion of the first insulation layer; selectively removing the portion of the first insulation layer which is exposed in the second region; removing the mask pattern and the barrier layer remaining in the first region; and forming a second insulation layer on the first insulation layer in the first region and on the semiconductor substrate in the second region, wherein removal of the portion of the first insulation layer is conducted using an etching solution comprising propylene glycol, HF and amine.

The first region may be a cell region and the second region may be a peripheral region.

The barrier layer may include at least one of a nitride layer, an amorphous carbon layer and a bottom anti-reflective coating (BARC) layer.

The barrier layer may be formed at a thickness of between about 200~250 Å.

The step of removing the portion of the barrier layer in the second region may be implemented using an $O_2$ and $N_2$ gaseous mixture.

The step of removing the portion of the barrier layer in the second region may be implemented for about 20~40 seconds.

The removal of the portion of the first insulation layer may be conducted for about 80~120 seconds.

Removal of the barrier layer in the first region may be conducted for about 300~600 seconds.

The removal of the barrier layer in the first region may be conducted using sulfuric peroxide mixture (SPM) solution.

The removal of the barrier layer in the first region may be conducted using an SPM solution at a temperature of about 180~240° C.

The SPM solution may be prepared by mixing $H_2SO_4$ with $H_2O_2$ at a ratio of between about 4:1~10:1.

The method may further comprise the steps of sequentially forming, after forming the second insulation layer, a conductive layer and a hard mask layer on the second insulation layer; and forming gates, after forming the second insulation layer, in the first region and the second region of the semiconductor substrate by etching the hard mask layer, the conductive layer, and the second and first insulation layers.

DESCRIPTION OF SPECIFIC EMBODIMENT

In an embodiment of the present invention, in order to form a dual gate insulation layer which has a relatively large thickness in a cell region and a relatively small thickness in a peripheral region, a portion of a gate insulation layer in the peripheral region is selectively removed by conducting a wet etching process using an etching solution composed of propylene glycol, HF (hydrofluoric acid) and amine.

Since the etching solution composed of propylene glycol, HF and amine has a low etching selectivity towards an oxide layer, to the loss of an isolation layer that is caused in the wet etching process can be reduced and step formation between an active region and the isolation layer can be lessened in this embodiment.

Conventional fabrication techniques often times use a wet etching process that employs a buffered oxide etchant (BOE) solution which has a high etching selectivity for an oxide layer to perform wet etching. The BOE solution not only etches gate insulation layers in peripheral regions but also etches a substantial amount of an isolation layer. In contrast to more conventional fabrication techniques, the embodiment of the present invention conducts the wet etching process with an etching solution that has a low etching selectivity towards oxide layers. As a result of using the embodiment of the present invention, the loss of the isolation layer that is caused during the wet etching process can be reduced.

The BOE solution of the conventional art exhibits a higher etching selectivity for an SOD (spin-on dielectric) insulation layer than that towards for a thermal oxide layer. Accordingly, when using the BOE solution of the conventional art, more loss occurs in the isolation layer comprising an SOD layer than in the gate insulation layer comprising a thermal oxide layer. In contrast because the etching solution in the embodiment of the present invention used when conducting the wet etching process is composed of propylene glycol, HF and amine exhibits a low selectivity etching selectivity towards an oxide layer, and as a result the loss of the isolation layer can be effectively reduced.

Hereafter, a specific embodiment of the present invention will be described in detail with reference to the accompanying drawings.

It is understood herein that the drawings are not necessarily to scale and in some instances proportions may have been exaggerated in order to more clearly depict certain features of the invention.

FIGS. 1A through 1I are cross-sectional views illustrating the processes of a method for manufacturing a semiconductor device in accordance with an embodiment of the present invention.

Figure 1A:
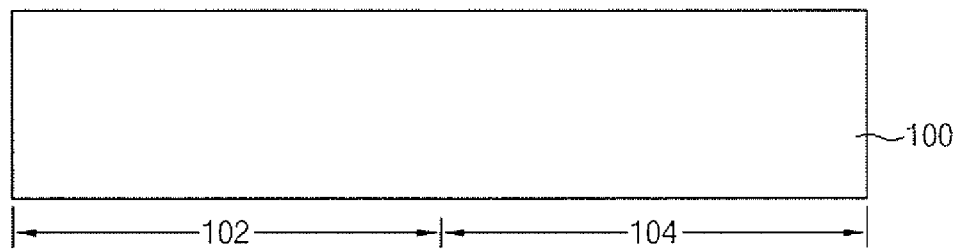
FIGS. 1A through 1I are cross-sectional views illustrating the processes of a method for manufacturing a semiconductor device in accordance with an embodiment of the present invention.

Referring to FIG. 1A, an ion implantation process is conducted to form a well in a semiconductor substrate 100 which has a cell region 102 and a peripheral region 104, and an isolation layer (not shown) is formed to delimit active regions. The isolation layer is formed as an SOD (spin-on dielectric) insulation layer which exhibits excellent gapfill characteristics.

Figure 1B:
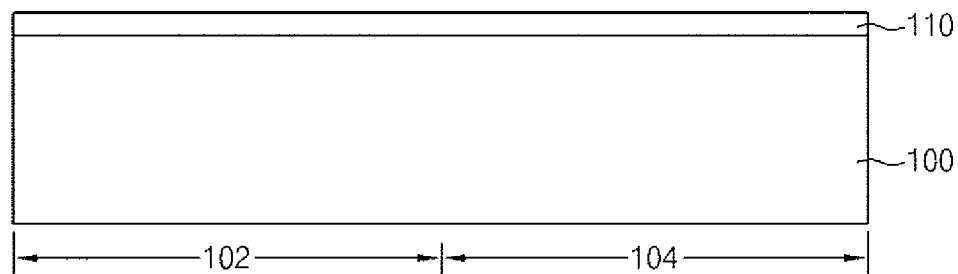

Referring to FIG. 1B, a first insulation layer 110 is formed in both the cell region 102 and the peripheral region 104 of the semiconductor substrate 100 which is already formed with the isolation layer. The first insulation layer 110 is formed, for example, by using a thermal oxidation process to produce a thickness of about 10~60 Å.

Figure 1C:
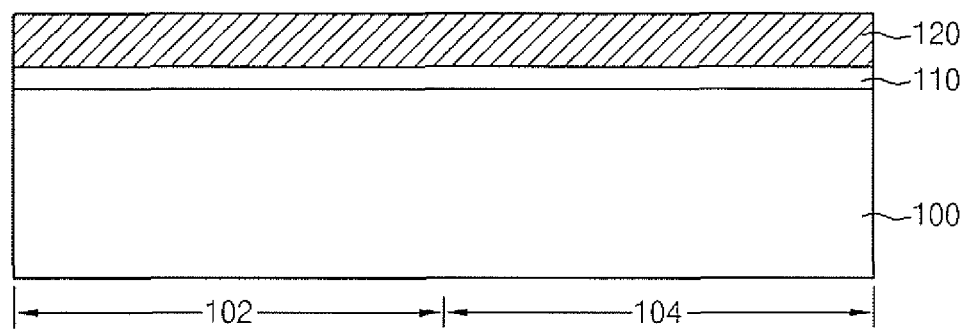

Referring to FIG. 1C, a barrier layer 120 is next formed onto the first insulation layer 110 in the cell region 102 and the peripheral region 104. The barrier layer 120 is formed as at least one of a nitride layer and an amorphous carbon layer, for example, to a thickness of about 200~250 Å.

The barrier layer 120 may be formed as a bottom anti-reflective coating (BARC) layer. At this time, the BARC layer of the barrier layer 120 is formed as a layer containing polymer for assisting the patterning of a photoresist layer which will be subsequently formed. For example, the BARC layer of the barrier layer 120 is formed as a layer containing polymer and at least any one of a thermoacid generator (TAG), a cross linker and an absorber. The BARC layer of the barrier layer 120 functions to absorb light in a subsequent photolithographic process, impart offset interference under the photoresist layer and minimize generation of standing waves. The BARC layer of the barrier layer 120 provides advantages in that it can be easily applied in subsequently fabricating a line.

Figure 1D:
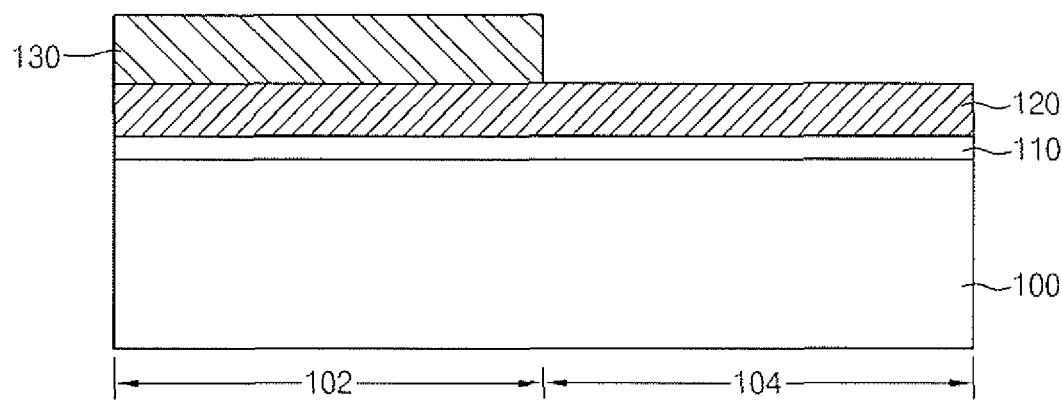

Referring to FIG. 1D, a mask pattern 130 is formed on the barrier layer 120 to cover the cell region 102 and to leave the peripheral region 104 open. The mask pattern 130 is formed, for example, as a photoresist pattern.

Figure 1E:
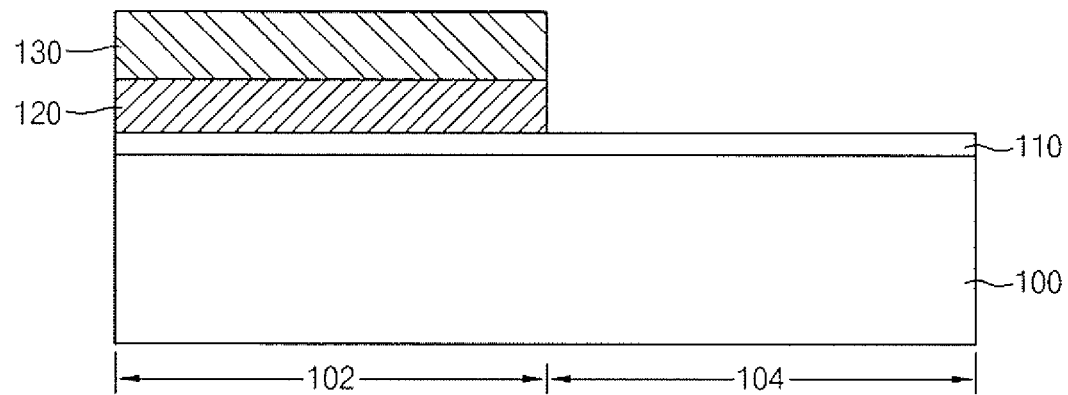

Referring to FIG. 1E, a portion of the barrier layer 120, which is exposed through the mask pattern 130 in the peripheral region 104, is removed to expose an underlying portion of the first to insulation layer 110. The portion of the barrier layer 120 in the peripheral region 104 is removed, for example, using a $O_2$ and $N_2$ gas mixture for about 20~40 seconds.

Figure 1F:
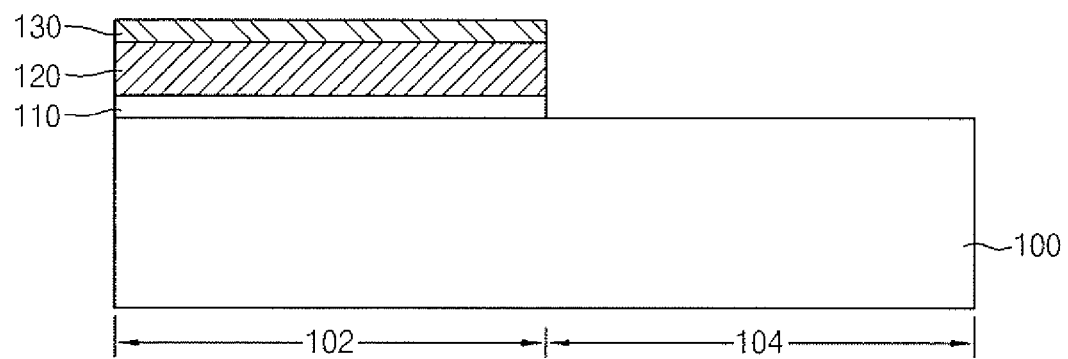

Referring to FIG. 1F, the portion of the first insulation layer 110, which is exposed due to the removal of the portion of the barrier layer 120 in the peripheral region 104, is next selectively removed. The portion of the first insulation layer 110 in the peripheral region 104 is removed by conducting a wet etching process that uses an etching solution composed of propylene glycol, HF (hydrofluoric acid) and amine for about 80~120 seconds, and preferably for about 100 seconds.

Here, since the etching solution composed of propylene glycol, HF and amine exhibits a low etching selectivity towards an oxide layer. Accordingly, while conducting the wet etching process of the present invention then losses to the isolation layer in the exposed peripheral region 104 can be reduced.

Because the etching solution composed of propylene glycol, HF and amine is a low selectivity etching solution, then when conducting the wet etching process, not only the portion of the first insulation layer 110 exposed in the peripheral region 104 is removed but also the entire thickness of the mask pattern 130 in the cell region 102 is removed. Even when the mask pattern 130 in the cell region 102 is entirely removed by the wet etching process, since the barrier layer 120 is formed under the mask pattern 130, a portion of the first insulation layer 110 which remains in the cell region 102 is not removed.

Referring to Table 1 given below, in the case of the present invention in which the wet etching process is conducted using the low selectivity etching solution composed of propylene glycol, HF and amine, for example, about 100 seconds are required to remove the first insulation layer 110 of a thickness of about 60 Å. Thus, the time required for conducting the wet etching process can be shortened to between about ½~⅓ as compared to the conventional art. Accordingly, in the present invention, the loss of the isolation layer that is caused during the wet etching process can be effectively reduced.

TABLE 1

| | Conventional BOE Solution | | | | | Present Etching Solution | | | | |
|---|---|---|---|---|---|---|---|---|---|---|
| Time [Sec] | 240 | 230 | 220 | 200 | 180 | 105 | 100 | 95 | 90 | 80 |
| Etch Amount of Insulation Layer [Å removed] | 57.6 | 55.2 | 52.8 | 48.0 | 43.2 | 62.0 | 59.0 | 56.1 | 53.1 | 47.2 |

Figure 1G:
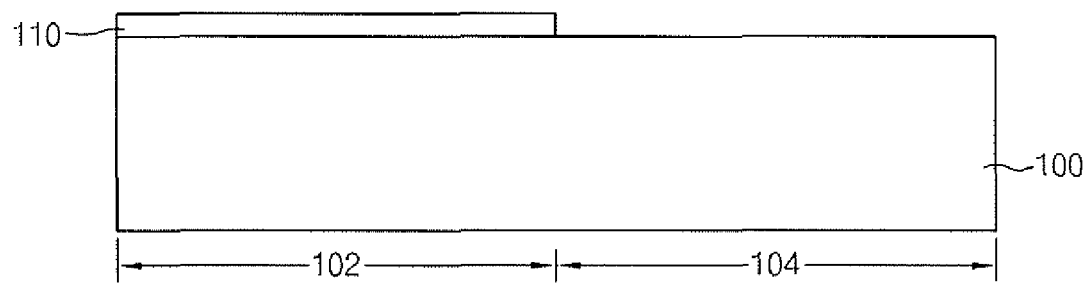

Referring to FIG. 1G, after removing the portion of the first insulation layer 110 in the peripheral region 104, the barrier layer 120 which remain in the cell region 102 are removed. The barrier layer 120 in the cell region 102 is removed using a hot SPM (sulfuric peroxide mixture) solution, preferably, an SPM solution of about 180~240° C. for about 300~600 seconds. The SPM solution is a solution which is prepared, for example, by mixing an $H_2SO_4$ solution and an $H_2O_2$ solution at a ratio of between about 4:1~10:1. By doing this, after the barrier layer 120 is removed, residues containing substances, such as carbon, no longer substantially occur.

Figure 1H:
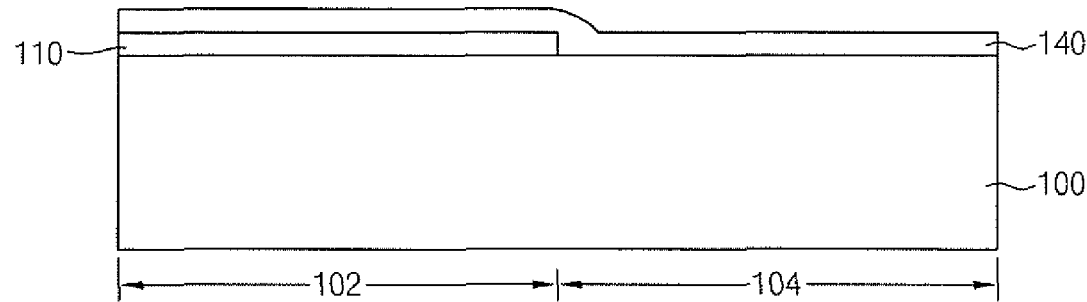

Referring to FIG. 1H, a second insulation layer 140 is shown formed on the first insulation layer 110 in the cell region 102 and on the semiconductor substrate 100 in the peripheral region 104. The second insulation layer 140 is formed to have a thickness of, for example, about 10~60 Å. As a result, a relatively thick gate insulation layer is formed in the cell region 102 since both the first and second insulation layers 110 and 140 remain therein, and a relatively thin gate insulation layer is formed in the peripheral region 104 since only the second insulation layer 140 remains therein.

Figure 1I:
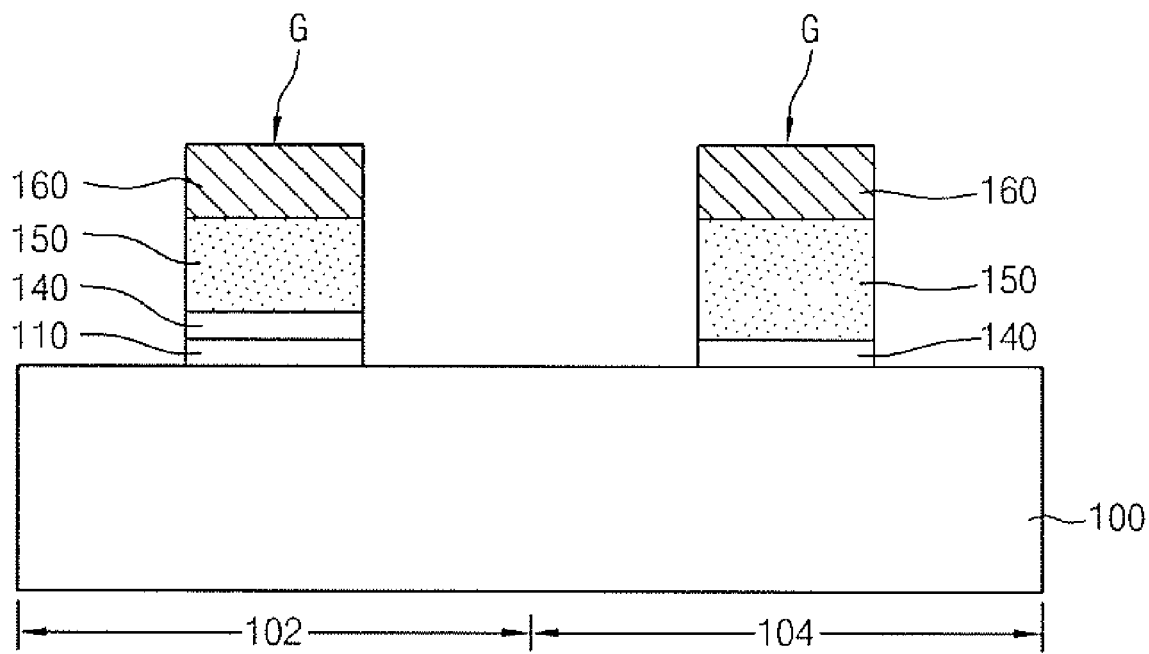

Referring to FIG. 1I, a conductive layer 150 and a hard mask layer 160 are sequentially formed on the second insulation layer 140. Then, by etching the hard mask layer 160, the conductive layer 150, and the second and first insulation layers 140 and 110, gates G are formed in the cell region 102 and the peripheral region 104 of the semiconductor substrate 100.

Thereafter, while not shown in drawings, by sequentially conducting a series of subsequent processes, the manufacture of a semiconductor device according to the embodiment of the present invention is completed.

As is apparent from the above description, in the embodiment of the present invention, since a gate insulation layer in a peripheral region is selectively removed through a wet etching process using a low selectivity etching solution having a low etching selectivity for an oxide layer, that is, an etching solution composed of propylene glycol, HF and amine, the loss of an isolation layer that is caused during the wet etching process can be reduced.

Therefore, in the present invention, step formation between an active region and the isolation layer that results from the loss of the isolation layer can be lessened, whereby the characteristics of a gate insulation layer can be stabilized. Also, in the present invention, as the step formation between the active region and the isolation layer is lessened, when conducting a masking process and an etching process for forming gates, it is possible to substantially prevent residues from being created on a step portion. Through this, in the present invention, the occurrence of defects in a semiconductor substrate is substantially prevented, and the characteristics and reliability of a semiconductor device can be improved.

Meanwhile, in another embodiment of the present invention, when removing the first insulation layer in the peripheral region, it is possible to use other etching solutions having an etching selectivity of 1:1 between a thermal oxide layer and other materials. Further, it is conceivable that a dry etching process is conducted using, instead of the etching solution, an etching gas having an etching selectivity similar to that of the etching solution.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming a first insulation layer on a semiconductor substrate which has a first region and a second region;
    forming a barrier layer on the first insulation layer;
    forming a mask pattern on the barrier layer to expose the second region;
    removing a portion of the barrier layer which is exposed in the second region to expose a portion of the first insulation layer;
    removing the portion of the first insulation layer exposed in the second region and removing the entire thickness of the mask pattern in the first region;
    removing the barrier layer that remains in the first region; and
    forming a second insulation layer on the first insulation layer in the first region and on the semiconductor substrate in the second region,
    wherein removal of the portion of the first insulation layer exposed in the second region and removal of the entire thickness of the mask pattern in the first region is conducted using an etching solution comprising propylene glycol, HF and amine.

2. The method according to claim 1, wherein the first region is a cell region and the second region is a peripheral region.

3. The method according to claim 1, wherein the barrier layer includes at least one of a nitride layer, an amorphous carbon layer and a bottom anti-reflective coating (BARC) layer.

4. The method according to claim 1, wherein the barrier layer is formed at a thickness of between about 200~250 Å.

5. The method according to claim 1, wherein the step of removing the portion of the barrier layer in the second region is implemented using a $O_2$ and $N_2$ gaseous mixture.

6. The method according to claim 1, wherein the step of removing the portion of the barrier layer in the second region is implemented for about 20~40 seconds.

7. The method according to claim 1, wherein the removal of the portion of the first insulation layer is conducted for about 80~120 seconds.

8. The method according to claim 1, wherein removal of the barrier layer in the first region is conducted for about 300~600 seconds.

9. The method according to claim 1, wherein the removal of the barrier layer in the first region is conducted using a sulfuric peroxide mixture (SPM) solution.

10. The method according to claim 9, wherein the removal of the barrier layer in the first region is conducted using an SPM solution at a temperature of about 180~240° C.

11. The method according to claim 9, wherein the SPM solution is prepared by mixing $H_2SO_4$ with $H_2O_2$ at a ratio of between about 4:1~10:1.

12. The method according to claim 1, further comprising the steps of:
    sequentially forming, after the step of forming the second insulation layer, a conductive layer and a hard mask layer on the second insulation layer; and
    forming gates, after the step of forming the second insulation layer, in the first region and the second region of the semiconductor substrate by etching the hard mask layer, the conductive layer, and the second and first insulation layers.

* * * * *